United States Patent [19]
Uekita et al.

[11] Patent Number: 4,907,043
[45] Date of Patent: Mar. 6, 1990

[54] POLYCRSTALLINE ELECTROLUMINESCENT DEVICE WITH LANGMUIR-BLODGETT FILM

[75] Inventors: Masakazu Uekita, Kobe; Yasunori Yoshioka, Ashiva, both of Japan

[73] Assignee: Kanegafuchi Kagaku Kogyo Kabushiki Kaisha, Osaka, Japan

[21] Appl. No.: 313,294

[22] Filed: Feb. 21, 1989

Related U.S. Application Data

[63] Continuation of Ser. No. 235,788, Aug. 22, 1988, abandoned, which is a continuation of Ser. No. 842,607, Mar. 12, 1986, abandoned.

[30] Foreign Application Priority Data

| | | | |
|---|---|---|---|
| Mar. 22, 1985 | [JP] | Japan | 60-58744 |
| May 9, 1985 | [JP] | Japan | 60-98395 |
| Aug. 21, 1985 | [JP] | Japan | 60-184922 |
| Aug. 21, 1985 | [JP] | Japan | 60-184923 |

[51] Int. Cl.[4] .......... H01L 33/00

[52] U.S. Cl. .......... 357/17; 357/59; 357/63; 357/4; 357/8; 427/66; 313/504; 313/506

[58] Field of Search .......... 357/4, 8, 17, 23.1, 357/23.15, 59 A, 59 R, 59 G, 63; 427/66; 313/504, 506

[56] References Cited

U.S. PATENT DOCUMENTS

| | | | |
|---|---|---|---|
| 4,480,009 | 10/1984 | Berger | 357/8 X |
| 4,496,610 | 1/1985 | Canell et al. | 427/66 |
| 4,627,029 | 12/1986 | Wilson et al. | 365/120 X |
| 4,659,177 | 4/1987 | Choe et al. | 350/96.34 |
| 4,672,265 | 6/1987 | Eguchi et al. | 427/66 X |

FOREIGN PATENT DOCUMENTS

| | | | |
|---|---|---|---|
| 0690660 | 10/1979 | U.S.S.R. | 427/66 |
| 1292544 | 10/1972 | United Kingdom | 427/66 |
| 01353143 | 5/1974 | United Kingdom | 427/66 |
| 2155689 | 9/1985 | United Kingdom | . |

OTHER PUBLICATIONS

Fowler et al., "Forward Bias Electroluminescence from Phtalocyamine Langmuir-Blodgett Film/ZNSES MIS Diodes," *Journal of Molecular Electronics*, vol. 1, 1985, pp. 93–95.

Wright et al., "The Organometallic Chemical Vapour Deposition of ZnS and ZnSe at Atmospheric Pressure," *Journal of Crystal Growth*, 59 (1982), 148–154.

Batey et al., "Electroluminescence in Gap/Langmuir-Blodgett Film Metal/Insulator/Semiconductor Diodes," *Thin Solid Films*, 99 (1983), 283–290.

Roberts, "Transducer and Other Applications of Langmuir-Blodgett Films," *Sensors and Actuators, 4 (1983), 131–145.*

Okamoto et al., "Low-Threshold-Voltage AC Thin Electroluminescent Device," *Japanese Journal of Applied Physics*, vol. 20, (1981), Supp. 20-1, pp. 215–220.

Walker et al., "Low-Voltage Tunnel-Injection Blue Electroluminescence in ZnS MIS Diodes," *Journal of Applied Physics*, vol. 47, No. 5, May 1976, 2129–2133.

*Primary Examiner*—William Mintel
*Attorney, Agent, or Firm*—Armstrong, Nikaido, Marmelstein, Kubovcik & Murray

[57] ABSTRACT

An electroluminescent device comprising a first electrode, a radiating layer adjacent to the first electrode, a second electrode and an organic thin film provided between the radiating layer and the second electrode, wherein the radiating layer is a polycrystalline thin film made of a II-IV compound. The provision of the organic thin film causes the electroluminescent device to have a high level of brightness, although it is driven at a low voltage.

14 Claims, 1 Drawing Sheet

POLYCRSTALLINE ELECTROLUMINESCENT DEVICE WITH LANGMUIR-BLODGETT FILM

This application is a continuation of application Ser. No. 235,788 filed Aug. 22, 1988, now abandoned, which is a continuation of application Ser. No. 842,607 filed Mar 21, 1986, now abandoned

BACKGROUND OF THE INVENTION

The present invention relates to an electroluminescent device (referred as an EL device hereinafter), and more particularly to an EL device wherein an organic thin film is provided between a polycrystalline thin film made of a II-VI compound and an electrode.

The study of EL devices has been vigorously pursued as a result of the need for making electrical and electric equipment small, light and thin, and improving the quality of they display. Recently, there have been developed and commercialized thin film EL devices obtained by sandwiching a Mn-doped ZnS luminescent layer between insulating or dielectric layers, in the so-called double insulating layer structure. Though these devices have high brightness and long life, a practical problem has remained, namely the high AC driving voltage of about 200 V due to the existing insulating layers. These devices are very expensive, because IC which has high withstand voltage have to be custom made and employed in such devices.

There has been desired the development of thin film EL devices which can be driven under low voltage in order to solve the above-mentioned problem and whereby to simplify driving circuits and reduce the cost. For this purpose, there has been reported the possibility of reducing the operational voltage to about 60 V by using ferroelectrics such as lead titanate (Japanese Journal of Applied Physics Vol. 20 (1981) Supplement 20-1 pp 215–220). However, the desirable devices which can be driven at the voltage of not more than 50 V have not been realized, so the EL devices have not been widely used due to high cost. Further, DC driving EL devices having MIS (Metal/Insulating Layer/Semiconductor) structure or M$\pi$S (Metal/Semiinsulating-layer/semiconductor) structure have been briskly studied.

There have been developed blue-light emitting EL devices, for example, wherein single crystalline ZnS or ZnSe is epitaxially grown on bulk single crystals such as ZnS, ZnSe, GaP or GaAs. Then there is formed an insulating layer or semi-insulating layer of ZnO or ZnS thereon by heat-treatment, acid-treatment, evaporation or MOCVD (Metal-Organic Chemical Vapor Deposition) method, and the like.

A group including Dr. Roberts of Durham University has been studying MIS EL devices wherein Langmuir Blodgett films are deposited on ZnS or ZnSe single crystalline thin films which are epitaxially grown on n-GaP single crystals in order to obtain blue-light emitting EL devices.

In case of using bulk ZnS or ZnSe single crystals, it is difficult at this stage to make large-area single crystals suitable for EL devices of large area, and accordingly the use of bulk ZnS or ZnSe single crystal is only examined at the laboratory.

On the other hand, in case of using epitaxially grown single crystalline thin films on n-GaP single crystals, and the like, the above-mentioned problem is to some extend solved. However, it is practically difficult to produce large-area devices of, for example, 200×200 mm because the size of such devices is determined by the size of single crystalline wafers used. Accordingly the cost of such devices is high.

It is an object of the present invention to remove the above-mentioned drawbacks by providing an electroluminescent device wherein an organic thin film is provided between a polycrystalline thin film made of II-VI compound and an electrode. The device of the present invention can radiate at low voltage and with high brightness and be obtained at low production cost and in a large area.

SUMMARY OF THE INVENTION

In accordance with the present invention, there is provided an EL device wherein an organic thin film of 20 to 2000 Å, preferably 25 to 1000 Å in thickness formed by a Langmuir-Blodgett technique, and the like is provided between a polycrystalline thin film made of II-VI compound and an electrode.

According to the EL device of the present invention, it is possible to drive the device at low voltage and with high brightness due to the existence of the organic thin film. In the method employed in the present invention, there can be selected a low temperature process which is essentially carried out at about room temperature, whereby there can be avoided an undesirable reaction which occurs at grain boundaries at high temperature or when using highly reactive material. Moreover, according to the present invention, a large-area device can be obtained at low production cost.

DETAILED DESCRIPTION

Figure 1:
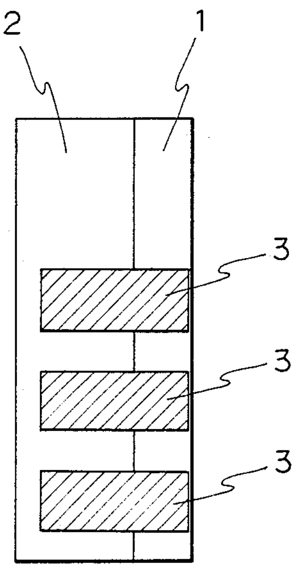
FIG. 1 is a view explaining the concept of patterned electrode in Examples of the present invention.

A polycrystalline thin film used in the present invention, which is an active material for radiating, is made of a II—VI compound. A II-VI compound can be obtained by the combination of at least one element selected from Group $II_A$ or Group $II_B$ of the periodic table and at least one element selected from Group $VI_B$ of the periodic table. The thin film can be formed on a substrate by using vacuum evaporation method, sputtering method, spray pyrolysis method, coating method, CVD method (Chemical Vapor Deposition method), MOCVD method (Metal-organic Chemical Vapor Deposition method), MBE method (Molecular Beam Epitaxy method), ALE method (Atomic Layer Epitaxy method), and the like.

Representative examples of the polycrystalline thin film made of II-VI compounds are polycrystalline thin films comprising ZnO, ZnS, ZnSe, ZnTe, CdS, CdSe, CdTe, CaS, SrS, and the like wherein the thin films are made in accordance with the above-mentioned methods. II-VI compounds can, of course, exist as solid solution and accordingly there can be used in the present invention a solid solution obtained by substituting an element of the above compounds for other elements. For example, there can be used $Zn_xCd_{1-x}S$ (wherein x satisfies the relationship of $0<x<1$) obtained by substituting a part of Zn for Cd, $ZnS_{x'}$, $Se_{1-x'}$, (wherein x' is satisfies the relationship of $0<x'<1$) obtained by substituting a part of S for Se, $Zn_zCd_{1-z}S_ySe_{1-y}$ (wherein y and z satisfy the relationship of $0<y<1$ and $0<z<1$)

obtained by substituting a part of Zn for Cd and a part of S for Se, and the like. There is included a II-VI compound wherein the ratio of Group II element to Group VI element is not necessarily 1 due to the existence of non-stoichiometric composition in II-VI compound.

These thin films as mentioned above are usually doped by Mn, Cu, Ag; rare earth metals such as Tb, Sm, Er, Ho, Pr and Tm; and rare earth fluorides such as $TbF_3$, $SmF_3$, $ErF_3$, $HoF_3$, $PrF_3$ and $TmF_3$. There might be used, if necessary, co-activators such as halogen ions and trivalent metals salts (for example Al) together with an activator.

0.01 to 7 parts, preferably 0.1 to 3 parts, by weight of activator is used per 100 parts by weight of the polycrystalline thin film made of II-VI compound, and 0.01to 3 parts, preferably 0.05 to 1 part, by weight of co-activator is used per 100 parts by weight of the polycrystalline thin film made of II-VI compound.

It is desirable to dope, as described above, the polycrystalline thin film made of II-VI compound in order to obtain various kinds of color such as red, green, blue, yellow, yellow orange. Process for doping the activator or co-activator into the thin film is not limited, and the usual processes can be employed in the present invention.

In case of obtaining visible-light emission by using the doped polycrystalline thin film made of II-VI compound, it is preferable to employ such a polycrystalline thin film that has large band gap of not less than 2.5 eV, if possible, in order that the II-VI compound, which is the matrix, does not absorb light in the visible region. From the viewpoint of this preferable band gap, it is suitable to use the polycrystalline thin film comprising ZnO, CaS, SrS, and the like besides ZnS or ZnSe.

Particularly desirable examples of the doped polycrystalline thin film are, for example, ZnSe:Mn wherein ZnSe is doped by Mn or ZnS:Mn wherein ZnS is doped by Mn from the viewpoint of luminescent efficiency.

The evaporation method, sputtering method, MBE method, MOCVD method, ALE method, and the like can be preferably employed as a method for forming the thin film as described above since it is preferable in the present invention to employ the polycrystalline thin film which is highly C-axis oriented and has superior crystallinity. In particular, from the viewpoint of obtaining polycrystals having high crystallinity the vacuum evaporation method, sputtering method is desirable and MBE method, MOCVD method or ALE method is more desirable. The polycrystalline thin film employed in the present invention is a crystalline thin film wherein a great deal of microcrystals are gathered to point in various directions. The thin film preferably has a regular orientation of microcrystals, and it more preferably has a fibrous or columnar structure.

The compound used in the present invention exists in the form of hexagonal system, cubic system or a mixture thereof, each of them being preferably employable in the present invention.

There has been known to form thin films made of a II-VI compound on substrates through a buffer layer in order to improve the crystallinity, or further known to improve the properties such as crystallinity by carrying out heat-treatment under various atmospheres. Heat-treatment can be carried out, if need be, after forming the thin film.

The thickness of the polycrystalline thin film, which is not limited particularly, is usually 100 Å to 10 $\mu$m, preferably 0.1 to 3 $\mu$m, more preferably 0.1 to 1 $\mu$m. It is preferable to employ thinner film because the thinner the polycrystalline thin film is, the lower the driving voltage is.

Now, a substrate and electrode are explained hereinafter. There can be used, as a substrate, a substrate comprising usual material such as glass, alumina, quartz, metal plate, metal foil, plastic plate, plastic film; polycrystalline wafer made of Group IV semiconductor or III-V compound semiconductor, and the like. Single crystalline wafer or silicon, wafer of 8 inch being now available, is of course included in the substance in the present invention. In-Hg, In-Ga, and the like are employable as an electrode at the side of the substrate (the first electrode). In case of employing a transparent substrate, it is preferable to use a transparent electrode made of tin oxide, indium tin oxide, and the like from the viewpoint of practical use. Examples of the desirable transparent electrode are ITO glass or NESA glass which is commercially available and has sheet resistance of 10 to 50 Ω/□ and visible radiation transmittance of about 80%.

Examples of a second electrode (an electrode at the other side of the substrate) are, for instance, metal indium, gold, platinum, palladium, silver, aluminum, Ti, Ni-Cr, In-Hg, In-Ga, and the like which are either translucent or opaque. This electrode might be provided on the substrate and the first electrode might be provided on the other side. Both of the electrodes (the first electrode and the second electrode) might be transparent. At least one of the electrodes is required to be translucent or transparent in order to obtain radiation. In case of using a device of the present invention as a display device, these two electrodes might be patterned as is usually carried out.

Next, an organic thin film, which is a major part of the present invention, is explained. The thickness of the organic thin film is 20 to 2000 Å, preferably 25 to 1000 Å. With the thickness of not more than 500 Å, preferably not more than 300 Å, carrier injections through the organic thin film can be expected. The thin film preferably has high dielectric strength and no pinhole. Materials of the organic thin film in the present invention can be selected from many kinds of organic materials since most of them are insulators. Examples of the technique for forming such a thin film as described above are vacuum evaporation method, sputtering method, CVD method, plasma polymerization method, electrolytic polymerization method, Langmuir-Blodgett technique, and the like.

With respect to the vacuum evaporation method applied for organic material, many studies have been carried out as a method for obtaining a thin film of pigments. By this method, there can be prepared films such as phthalocyanine, perylene red, perylene, polymeric materials, and the like. There can be, of course, employed a cluster ion beam method which is taken notice of as a method superior to vacuum evaporation method. The cluster ion beam method is suitable for forming thin films of anthracene, copper phthalocyanine, polyethylene, and the like. The obtained thin films have high degrees of orientation. There can be also employed thin films made of, for example, PPS (polyphenylene sulfide), polyvinyl alcohol, polymer of polycarbonate, and the like by using a sputtering method. There can be further employed thin films made of organic monomer by using a CVD method, photo CVD method, plasma polymerization method, electrolytic polymerization method, and the like wherein thin films are prepared by utilizing the energy of heat, light, plasma, and the like.

The Langmuir-Blodgett technique is suitably used in forming the organic thin films in the present invention. According to this technique, there can be obtained the organic thin films having high degree of orientation without pinholes, and the thickness of the organic thin films is controllable to several tens of Å.

A langmuir-Blodgett film is now explained hereinafter. In preparing Langmuir-Blodgett films, there can be employed, for example, a Langmuir-Blodgett technique wherein molecules for forming a monomolecular film are firstly spreaded on the water surface, the spreaded molecules are compressed slowly up to constant surface pressure to form the continuous monomolecular film, and then the obtained film is transferred onto the substrate. The horizontal dipping method, rotating cylinder method, and the like (Interface and Colloid, New Experiment Chemical Lecture, Vol. 18, pp 498–508) are also employable in preparing Langmuir-Blodgett films. In short, there can be employed any method which is usually used in preparing Langmuir-Blodgett films.

In case of preparing MIS or MπS devices which contain inorganic material as an insulator, undesirable reactions are apt to take place at the grain boundaries of polycrystalline thin films since this process usually uses a reactive reagent and is carried out under high temperature, whereby it has been found to be difficult to obtain good junctions. In case of employing the organic film prepared by a usual coating method as an insulating layer, the above drawback is removed. It is, however, technically difficult to form a film of 20 to 2000 Å, preferably 25 to 1000 Å, in thickness. This range of thickness is desirable for a device having MIS structure, but in accordance with the coating method it is almost impossible to obtain a film of less than 0.1 μm in thickness without pinholes.

In order to obtain an EL device comprising a polycrystalline thin film made of a II-VI compound which can be driven at low voltage and with high brightness, it is suitable to employ an organic thin film of 20 to 2000 Å, preferably 25 to 1000 Å, in thickness. According to Langmuir-Blodgett technique preferably employed in the present invention, the thin film of the above thickness is easily formed by varying the kind of material used or the numbers of layers piled up. The technique further has an advantage that there are no undesirable reactions, which are apt to take place at the grain boundaries due to high temperature or high reactivity of reagents, since this technique is essentially a low temperature process which is carried out at about room temperature.

As a material for forming Langmuir Blodgett films, there can be employed higher fatty acid which are representative examples of the material for Langmuir-Blodgett films, esters of higher fatty acids, polymerizable unsaturated fatty acids such as ω-tricosanoic acid, α-octadecyl acrylic acid and unsaturated esters like vinyl stearate. There can also be employed diacetylene derivatives whose formula are $CH_3(CH_2)_mC{\equiv}C{-}C{\equiv}C(CH_2)_nCOOH$ (wherein m and n are positive integral number which satisfy the relationship of $16 \leqq m+n \leqq 25$; examples of the combination of m+n are, for instance, m=8 or 9 and n=8, or m=11 or 13 and n=8), of diacetylene derivatives including benzene ring of which formula are

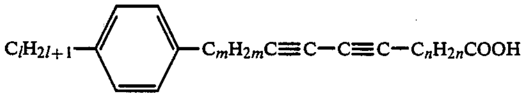

(wherein l, m and n satisfy the relationship of $l \geqq 0$, $m \geqq 0$, $n \geqq 0$ and $8 \leqq l+m+n \leqq 25$). The formula of the diacetylene derivative including benzene ring is shown in the specification of Japance patent application No. 257118/1984 which was formerly filed by us. In case of employing materials having a polymerizable functional group, the polymerization can be carried out by the help of various kinds of radiation energy when the material is on the water surface or on the substrate. Polymerized films obtained in this manner might be employed in the present invention.

There can of course be employed anthracene amphiphilic amphoteric compounds having alkyl, phenyl or phenylalkyl substituents phthalocyanines, and the like. Further, there can be employed polymers such as polyacids, polyalcohols, polypeptides, polyazomethine as long as Langmuir-Blodgett films are obtainable therefrom. Langmuir-Blodgett films are still further obtainable as metal salts by the addition of ions of metals such as Ba, Ca, Cd, Co, Mn, Pb in the water.

In the EL device of the present invention, there might be provided the organic thin film between the electrode at the side of the substrate and the polycrystalline thin film made of II-VI compound. In that case, however, the organic thin film is required to be selected from such materials that are resistant the heat during the formation of the polycrystalline thin film made of a II-VI compound. Since many kinds of organic thin films are not resistant to the above heat, it is preferable to form the polycrystalline thin film made of the II-VI compound on the electrode at the side of the substrate, succeedingly to carry out heat treatment if necessary, and to provide the organic thin film thereon.

There can be employed two driving methods, that is, AC driving method and DC driving method as a method for driving an EL device wherein the organic thin film is provided between the polycrystalline thin film made of II-VI compound and the metal electrode. In the case of the AC driving method, there can be employed a relatively thicker organic thin film since electric current is not required to flow through the organic thin film. The thinner film is of course desirable since it can be driven at low voltage. On the other hand, in the case of DC driving method, electric current is required to flow through the organic thin film. So it becomes important to form the organic film of not more than 500 Å, preferably not more than 300 Å. Through the film of such thickness, carriers can be injected.

In accordance with the present invention, there can be obtained the EL device which can be driven at low voltage and with high brightness since the organic thin film can be made very thin. It has also been found that the organic thin film in the present invention prevents the device from being dielectrically broken down since the organic thin film has high withstand voltage.

Especially in the case of DC-driving the EL device of the present invention wherein the organic thin film is provided between the polycrystalline thin film made of II-VI compound and the metal electrode, the injection efficiency of the carriers is improved owing to the existence of the organic thin film, although detailed explanations are expected to require further investigations.

As is usually carried out, sealing might be performed in order to obtain a stable device.

The EL device of the present invention is now explained according to the following Examples and the Comparative Examples.

EXAMPLE 1 AND COMPARATIVE EXAMPLE 1

A Mn-doped ZnS layer (hereinafter referred as ZnS(Mn) layer) was formed by employing a spray pyrolysis method on patterned ITO (NA-40 glass made by HOYA CORP.) having a sheet resistance of 15 Ω/□ and visible radiation transmittance of about 80%. The sheet resistance and visible radiation transmittance were values measured before the patterning of ITO was carried out (hereinafter the same). When forming the Zn(Mn) layer, there was used an aqueous solution wherein $ZnCl_2$, thiourea and $MnCl_2$ were added thereto to satisfy the relationship of Zn:S:Mn=1:2.4:0.5 (atomic ratio). The temperature of the substrate was 400° C.

The obtained ZnS(Mn) thin film was a polycrystalline thin film of about 0.5 μm in thickness and had the priority orientation in the (111) direction. The thin films were heat-treated at 450° C. for 1 hour in nitrogen flow, thereafter, five layers of cadmium stearate of 125 Å in total thickness were deposited on it by employing usual Langmuir-Blodgett technique under the following conditions.

Cd# concentration: $4\times10^{-4}$M/l
pH: about 6.2
surface pressure: 25 dyne/cm
cumulative velocity: 10 mm/min After drying the obtained thin film for one day, aluminum metal was evaporated in such a manner that the Aluminum pattern intersected the ITO (indium tin oxide) pattern in order to obtain an MIS device.

Figure 2:
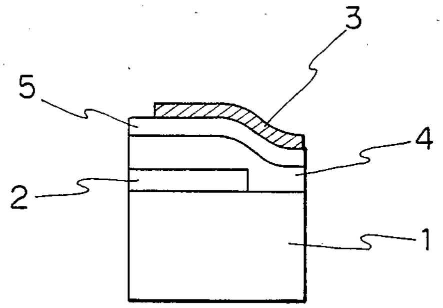
FIG. 2 is a sectional view of a device made in Examples of the present invention.

The patterned ITO glass was obtained by an etching method in order that ITO 2 of 8×39 mm was left on the surface of the glass substrate 1 as shown in FIG. 1 wherein Aluminum of 3×11 mm was evaporated in such a manner that the Aluminum pattern intersected the ITO pattern. In FIGS. 1 and 2, numerals 3, 4 and 5 are aluminum, radiating layer and Langmuir-Blodgett film respectively.

In case of applying DC voltage to the obtained device in such a manner that the ITO electrode is positive and aluminum electrode is negative, there was emitted yellow orange light. Threshold voltage and brightness were 10 V and 2 fL (at 20 V) respectively.

Evaluation for comparison was carried out using MS devices (Comparative Example 1) made in the same manner as in Example 1 except that Langmuir-Blogett films were not provided, wherein threshold voltage and brightness were 20 V and 0.04 fL (at 40 V) respectively.

EXAMPLE 2 AND COMPARATIVE EXAMPLE 2

Mn-doped ZnSe thin films of about 0.4 μm in thickness were formed by employing a MBE method on patterned ITO (NA-40 glass made by HOYA CORP.) having sheet resistance of 15 Ω/□ and visible radiation transmittance of about 80%. That is, Zn, Se and Mn were charged individually into cells for generating a molecular beam in an ultra-high vacuum bell jar, and then molecular beams were radiated from each cell onto ITO glass to form Mn-doped ZnSe thin films. On the obtained ZnSe:Mn thin films, five layers of cadmium stearate of 125 Å in total thickness were deposited by employing a usual Langmuir-Blodgett technique under the following conditions.

Cd# concentration: $4\times10^{-4}$M/l
pH: about 6.2
surface pressure: 25 dyne/cm
cumulative velocity: 10 mm/min After drying the obtained thin film for one day, aluminum metal was evaporated in such a manner that the Aluminum pattern intersected the ITO pattern as shown in FIG. 1 in order to obtain EL devices.

In case of applying DC voltage to the obtained device in such a manner that the ITO electrode is positive and the aluminum electrode is negative, threshold voltage and maximum brightness were 16.5 V and 20 fL (at 23 V) respectively.

Evaluation for comparison was carried out using devices (Comparative Example 2) made in the same manner as in Example 2 except that Langmuir-Blodgett films were not provided, wherein threshold voltage and maximum brightness were 16 V and 4.8 fL (at 20 V) respectively and the devices were broken down at 20 V.

EXAMPLE 3 AND COMPARATIVE EXAMPLE 3

Mn-doped ZnS layers were formed by employing spray pyrolysis method on the patterned ITO (NA-40 glass made by HOYA CORP.) having sheet resistance of 15 Ω/□ and visible radiation transmittance of about 80%. When forming Zn(Mn) layers, there was used an aqueous solution wherein $ZnCl_2$, thiourea and $MnCl_2$ were added thereto to satisfy the relationship of Zn:S:Mn=1:2.4:0.05 (atomic ratio). The temperature of the substrate was 400° C.

The obtained ZnS(Mn) thin films were polycrystalline thin films of about 0.5 μm in thickness wherein crystals had the priority orientation in the (111) direction. The thin films were heat-treated at 450° C. for 1 hour in nitrogen flow, thereafter, twenty one layers of cadmium stearate of 525 Å in total thickness were deposited on the thin film by employing usual Langmuir-Blodgett technique under the following conditions.

Cd# concentration: $4\times10^{-4}$M/l
pH: about 6.2
surface pressure: 25 dyne/cm
cumulative velocity: 10 mm/min After drying the obtained thin film for one day, aluminum metal was evaporated in such a manner that the Aluminum pattern intersected the ITO pattern as shown in FIG. 1 in order to obtain devices.

In case of applying AC voltage (frequency: 60 Hz) to the obtained devices, there was emitted yellow orange light wherein threshold volatage and brightness were 15 V and 3fL (at 30 V) respectively.

Evaluation for comparison was carried out using devices (Comparative Example 3) made in the same manner as in Example 3 except that Langmuir-Blogett films were not provided, wherein threshold voltage and brightness were 25 V and 0.04 fL (at 50 V) respectively.

EXAMPLE 4 AND 5

The procedures of Example 1 were repeated except that cadmium salts of normal chain diacetylene ($CH_3(CH_2)_3C\equiv C-C\equiv C(CH_2)_8COOH$) (Example 4) and phthalocyanine (tetra-t-butylphthalocyanite) (Example 5) were employed instead of a cadmium stearate layer to form EL devices.

The experimental results were almost equal to Example 1, that is, there was emitted yellow orange light wherein threshold voltage and brightness were 10 V and 1.5 fL (at 20 V) respectively.

EXAMPLE 6 AND COMPARATIVE EXAMPLE 4

A ZnS(Mn) layer was formed by employing an electron beam evaporation method on patterned ITO glass having sheet resistance of 15 Ω/□ and visible radiation transmittance of about 80% using ZnS which included 0.7% by weight of Mn as a target under the following conditions.

Pressure during the evaporation: about $1\times10^{-6}$ torr
temperature of substrate: about 170° C.
velocity of forming films: about 10 A/sec The obtained ZnS(Mn) films were polycrystalline thin films of about 0.1 μm in thickness wherein crystals had the priority orientation in the (111) direction. The thin films were heat-treated at 600° C. for 1 hour in nitrogen flow, thereafter, five layers of cadmium stearate were deposited on the thin film in the same manner as in Example 1.

After drying the obtained thin film for one day, aluminum metal was evaporated in such a manner that the Aluminum pattern intersected the ITO pattern as shown in FIG. 1 in order to obtain the MIS device.

Threshold voltage and brightness measured in the same manner as in Example 1 were 16 V and 10 fL (at 22 V) respectively, and there was emitted yellow orange light.

Evaluation for comparison was carried out using MS devices (Comparative Example 4) made in the same manner as in Example 6 except that Langmuir-Blodgett films were not provided, wherein the devices were dielectrically broken down at about 10 V and there was not emitted any light.

EXAMPLE 7 AND COMPARATIVE EXAMPLE 5

A thin film of about 0.3 μm in thickness was formed, in the same manner as in Example 1, on patterned ITO glass using ZnS which included about 2% by weight of $TbF_3$ as a target under the following conditions.

temperature of substrate: 150° C.
high frequency power: about 1 w/cm$^2$
pressure of Ar gas: $10^{-2}$ torr The obtained thin films were heat-treated, thereafter, five layers of cadmium stearate were deposited on the thin film in the same manner as in Example 1.

The properties of the obtained MIS device were that the threshold voltage was 28 V, maximum brightness was 5 fL (at 33 V) and emitting color was green.

Evaluation for comparison was carried out using MS devices (Comparative Example 5) made in the same manner as in Example 7 except that Langmuir-Blodgett films were not provided, wherein threshold voltage and maximum brightness were 25 V and 0.2 fL (at 30 V) respectively and the devices were dielectrically broken down at 30 V.

EXAMPLE 8 AND COMPARATIVE EXAMPLE 6

A ZnS(Mn) layer was formed by employing an electron beam evaporation method on patterned ITO glass using ZnS which included 0.7% by weight of Mn as a target in the same manner as in Example 1 under the following conditions.

Pressure during the evaporation: about $1\times10^{-6}$ torr
temperature of substrate: about 170° C.
velocity of forming films: about 10 A/sec The obtained ZnS(Mn) thin films were polycrystalline thin films of about 0.3 μm in thickness wherein crystals had the priority orientation in the (111) direction. The thin films were heat-treated at 600° C. for 1 hour in nitrogen flow, thereafter, a hundred and one layers of cadmium stearate were deposited on the thin film in the same manner as in Example 1.

After drying the obtained thin film for one day, aluminum metal was evaporated in such a manner that the Aluminum pattern intersected the ITO pattern as shown in FIG. 1 in order to obtain the devices.

Threshold voltage and brightness measured in the same manner as in Example 3 were 25 V and 8 fL (at 32 V) respectively, and there was emitted yellow orange light.

Evaluation for comparison was carried out using MS devices (Comparative Example 6) made in the same manner as in Example 8 except that Langmuir-Blodgett films were not provided, wherein the devices were dielectrically broken down at about 15 V and there was not emitted any light.

EXAMPLE 9 AND COMPARATIVE EXAMPLE 7

A thin film of about 0.3 μm in thickness was formed, in the same manner as in Example 1, on patterned ITO glass using ZnS which included about 2% by weight of $TBF_3$ as a target under the following conditions.

temperature of substrate: 150° C.
high frequency power: about 1 w/cm$^2$
pressure of Ar gas: $10^{-2}$ torr The obtained thin films were heat-treated, thereafter, one hundred and one layers of cadmium stearate were deposited on the thin film in the same manner as in Example 1.

The properties of the obtained MIS device were that the threshold voltage was 30 V, maximum brightness was 4 fL (at 35 V) and emitting color was green.

Evaluation for comparison was carried out using MS devices (Comparative Example 7) made in the same manner as in Example 9 except that Langmuir-Blodgett films were not provided, wherein the threshold voltage was 28 V, the devices were dielectrically broken down at 30 V and there was not emitted any light.

EXAMPLES 10 TO 12

The procedures of Example 1 were repeated except that thin films of phthalocyanine (Example 10), stearic acid (Example 11) and polystyrene (Example 12) of about 200 Å in thickness were formed by an evaporation method instead of a Langmuir-Blodgett film of cadmium stearate under the following conditions.

pressure during the evaporation: $10^{-5}$ to $10^{-6}$ torr
velocity of forming films: about 1000 A/sec The properties of the devices made in the same manner as in Example 1 were that the threshold voltage was about 10 V, brightness was 1.0 to 1.5 fL (at about 20 V) and there was emitted yellow orange light.

EXAMPLE 13

The procedures of Example 1 were repeated except that thin films of polyethylene of about 200 Å in thickness were formed by a plasma polymerization method instead of a Langmuir-Blodgett film of cadmium stearate. The formation was carried out after the introduction of ethylene gas under the following conditions.

degree of vacuum: about $10^{-1}$ torr
power: 30 W
velocity of forming films: 100 Å/min The properties of the devices made in the same manner as in Example 1 were that the threshold voltage was 12 V, brightness was 1.2 fL (at 21 V) and there was emitted yellow orange light.

As is described above, according to an EL device of the present invention, it is possible to drive a device at low voltage and with high brightness since an organic thin film is formed on a polycrystalline thin film made of a II-VI compound.

What is claimed is:

1. An electroluminescent device comprising a first electrode, a radiating layer adjacent to said first electrode, a second electrode, appropriate biasing, and a Langmuir-Blodgett organic thin film having a thickness of not more than 2000 Å provided between said radiating layer and said second electrode, wherein said radiating layer is a polycrystalline thin film made of a II-VI compound doped by an activator which is at least one member selected from the group consisting of Mn, Cu, Ag, Tb, Sm, Er, Ho, Pr, Tm, $TbF_3$, $SmF_3$, $ErF_3$, $HoF_3$, $PrF_3$, and $TmF_3$, said II-VI compound being the combination of at least one element from group IIA and group IIB and at least one element from group VIB.

2. The device of claim 1, wherein the polycrystalline thin film made of a II-VI compound is further doped by a co-activator which is at least one member selected from the group consisting of halogen ions and trivalent metal salts.

3. The device of any one of claims 1 and 2, wherein said first electrode is a metal electrode, and said second electrode is a transparent electrode, and said Langmuir-Blodgett organic thin film and said metal electrode are provided on said polycrystalline thin film which is formed on a glass substrate provided with said transparent electrode.

4. The device of claim 1, wherein the thickness of the Langmuir-Blodgett organic thin film is not more than 1000 Å.

5. The device of claim 4, wherein said polycrystalline thin film made of a II-VI compound is further doped by a co-activator which is at least one member selected from the group consisting of halogen ions and trivalent metal salts.

6. The device of claim 4, wherein said first electrode is a transparent electrode, and said Langmuir-Blodgett organic thin film and said metal electrode are provided on said polycrystalline thin film which is formed on a glass substrate provided with said transparent electrode.

7. The device of claim 5, wherein said first electrode is a transparent electrode, and said Langmuir-Blodgett organic thin film and said metal electrode are provided on said polycrystalline thin film which is formed on a glass substrate provided with said transparent electrode.

8. The device of claim 1, wherein said polycrystalline thin film made of a II-VI compound is provided on a substrate, said Langmuir-Blodgett film is provided on the polycrystalline thin film, and a carrier injection electrode is provided on said Langmuir-Blodgett organic thin film, the thickness of the Langmuir-Blodgett organic thin film being not more than 500 Å, and said polycrystalline thin film made of a II-VI compound being doped by at least one dopant selected from the group consisting of activators and co-activators, provided that said dopant is at least one activator, said activator being at least one member selected from the group consisting of Mn, Cu, Ag, Tb, Sm, Er, Ho, Pr, Tm, $TbF_3$, $SmF_3$, $ErF_3$, $HoF_3$, $PrF_3$, and $TmF_3$, and said co-activator being at least one member selected from the group consisting of halogen ions and trivalent metal salts.

9. The device of claim 8, wherein the thickness of the Langmuir-Blodgett organic thin film is not more than 300 Å.

10. The device of claim 8, wherein said polycrystalline thin film made of a II-VI compound and doped by at least one dopant is selected from the group consisting of ZnSe: Mn and ZnS: Mn.

11. The device of claim 1, wherein said device is driven by AC current.

12. The device of claim 11, wherein said polycrystalline thin film made of a II-VI compound is further doped by a co-activator which is at least one member selected from the group consisting of halogen ions and trivalent metal salts.

13. The device of claim 11, wherein said polycrytalline thin film made of a II-VI compound is selected from the group consisting of ZnS and ZnSe.

14. The device of claim 11, wherein the activator is Mn.

* * * * *

UNITED STATES PATENT AND TRADEMARK OFFICE
CERTIFICATE OF CORRECTION

PATENT NO. : 4,907,043

DATED : March 6, 1990

INVENTOR(S) : UEKITA et al

It is certified that error appears in the above-identified patent and that said Letters Patent is hereby corrected as shown below:

On the cover page, Item [54], "POLYCRSTALLINE" should read --POLYCRYSTALLINE--;
Item [63], "March 12, 1986" should read --March 21, 1986--;
Item [57], line 7, "II-IV compound" should read --II-VI compound--.

Column 1, line 1, "POLYCRSTALLINE" should read --POLYCRYSTALLINE--;
line 67, "extend" should read --extent--.

Column 2, line 65, "$ZnS_x$, $Se_{1-x}$," should read --$ZnS_x$,$Se_{x-1}$,--.

Column 7, line 30, "Cd#" should read --$Cd^{++}$--.

Column 8, line 3, "Cd#" should read --$Cd^{++}$--;
line 42, "Cd#" should read --$Cd^{++}$--.

Column 9, line 13, "10A/sec" should read --10Å/sec--.

Column 10, line 51, "1000A/sec" should read --1000Å/sec--.

Signed and Sealed this

Twenty-seventh Day of August, 1991

*Attest:*

HARRY F. MANBECK, JR.

*Attesting Officer*

*Commissioner of Patents and Trademarks*